(12) United States Patent
Meyers et al.

(10) Patent No.: US 10,490,516 B2
(45) Date of Patent: Nov. 26, 2019

(54) PACKAGED INTEGRATED CIRCUIT DEVICE WITH CANTILEVER STRUCTURE

(71) Applicant: Intel Corporation, Santa Clara, CA (US)

(72) Inventors: John G. Meyers, Sacramento, CA (US); Bilal Khalaf, Folsom, CA (US); Sireesha Gogineni, Folsom, CA (US); Brian J. Long, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 20 days.

(21) Appl. No.: 15/870,708

(22) Filed: Jan. 12, 2018

(65) Prior Publication Data
US 2018/0138133 A1    May 17, 2018

Related U.S. Application Data

(62) Division of application No. 14/866,576, filed on Sep. 25, 2015, now Pat. No. 9,871,007.

(51) Int. Cl.
*H01L 23/58* (2006.01)
*H01L 21/52* (2006.01)
(Continued)

(52) U.S. Cl.
CPC .......... *H01L 23/585* (2013.01); *H01L 21/52* (2013.01); *H01L 22/34* (2013.01); *H01L 23/13* (2013.01); *H01L 23/3121* (2013.01); *H01L 25/0657* (2013.01); *H01L 25/16* (2013.01); *H01L 25/50* (2013.01); *H01L 22/32* (2013.01); *H01L 23/49816* (2013.01); *H01L 24/16* (2013.01);
(Continued)

(58) Field of Classification Search
None
See application file for complete search history.

(56) References Cited

U.S. PATENT DOCUMENTS 7,498,667 B2  3/2009  Ha
7,745,892 B1  6/2010  Ivanov et al.
(Continued)

FOREIGN PATENT DOCUMENTS

KR   1020040100348   12/2004

OTHER PUBLICATIONS

International Search Report and Written Opinion for PCT Patent Application No. PCT/US2016/044520 dated Oct. 28, 2016, 12 pgs.
(Continued)

*Primary Examiner* — Michelle Mandala
(74) *Attorney, Agent, or Firm* — Schwabe, Williamson & Wyatt, P.C.

(57) ABSTRACT

Techniques and mechanisms to facilitate connection with one or more integrated circuit (IC) dies of a packaged device. In an embodiment, the packaged device includes a first substrate coupled to a first side of a package, and a second substrate coupled to a second side of the package opposite the first side. Circuitry, coupled via the first substrate to one or more IC dies disposed in the package, includes a circuit structure disposed at a cantilever portion of the first substrate. The cantilever portion extends past one or both of an edge of the first side and an edge of the second side. In another embodiment, a hardware interface disposed on the second substrate enables coupling of the packaged device to another device.

5 Claims, 9 Drawing Sheets

(51) Int. Cl.
*H01L 21/66* (2006.01)
*H01L 25/065* (2006.01)
*H01L 25/00* (2006.01)
*H01L 23/13* (2006.01)
*H01L 25/16* (2006.01)
*H01L 23/31* (2006.01)
*H01L 23/498* (2006.01)
*H01L 23/00* (2006.01)

(52) U.S. Cl.
CPC .............. *H01L 24/32* (2013.01); *H01L 24/48* (2013.01); *H01L 24/73* (2013.01); *H01L 2223/6677* (2013.01); *H01L 2224/16227* (2013.01); *H01L 2224/16235* (2013.01); *H01L 2224/32145* (2013.01); *H01L 2224/32225* (2013.01); *H01L 2224/48091* (2013.01); *H01L 2224/48145* (2013.01); *H01L 2224/48147* (2013.01); *H01L 2224/48227* (2013.01); *H01L 2224/73265* (2013.01); *H01L 2225/0651* (2013.01); *H01L 2225/06506* (2013.01); *H01L 2225/06555* (2013.01); *H01L 2225/06562* (2013.01); *H01L 2225/06572* (2013.01); *H01L 2225/06593* (2013.01); *H01L 2225/06596* (2013.01); *H01L 2924/00014* (2013.01); *H01L 2924/1433* (2013.01); *H01L 2924/1436* (2013.01); *H01L 2924/1531* (2013.01); *H01L 2924/15162* (2013.01); *H01L 2924/15192* (2013.01); *H01L 2924/15311* (2013.01); *H01L 2924/15331* (2013.01); *H01L 2924/15333* (2013.01); *H01L 2924/1815* (2013.01); *H01L 2924/19041* (2013.01); *H01L 2924/19042* (2013.01); *H01L 2924/19043* (2013.01); *H01L 2924/19105* (2013.01); *H01L 2924/19106* (2013.01)

(56) References Cited

U.S. PATENT DOCUMENTS

| | | | |
|---|---|---|---|
| 8,710,675 | B2 | 4/2014 | Kim |
| 2006/0172463 | A1 | 8/2006 | Karnezos |
| 2007/0108581 | A1 | 5/2007 | Shim |
| 2007/0209437 | A1 | 9/2007 | Xue et al. |
| 2007/0241442 | A1 | 10/2007 | Ha |
| 2008/0073770 | A1 | 3/2008 | Yee |
| 2008/0136006 | A1 | 6/2008 | Jang |
| 2008/0157318 | A1 | 7/2008 | Chow |
| 2010/0155918 | A1 | 6/2010 | Kim |
| 2010/0207267 | A1 | 8/2010 | Lin |
| 2010/0244217 | A1 | 9/2010 | Ha |
| 2013/0036606 | A1 | 2/2013 | Keeth et al. |
| 2013/0195284 | A1* | 8/2013 | Yang .................... B81B 7/0061 381/91 |

OTHER PUBLICATIONS

International Preliminary Search Report for International Patent Application No. PCT/US2016/044520 dated Apr. 5, 2018, 9 pages.

* cited by examiner

FIG. 8 a
PACKAGED INTEGRATED CIRCUIT DEVICE WITH CANTILEVER STRUCTURE

CLAIM OF PRIORITY

This application is a divisional of U.S. patent application Ser. No. 14/866,576, entitled "PACKAGED INTEGRATED CIRCUIT DEVICE WITH CANTILEVER STRUCTURE," filed on Sep. 25, 2015, which is hereby incorporated by reference in its entirety

BACKGROUND

1. Technical Field

Embodiments discussed herein relate generally to packaged integrated circuit (IC) devices and more particularly, but not exclusively, to structures for positioning components of a packaged IC device.

2. Background Art

Mobile, tablet, and ultrabook technologies require semiconductor device packages with increasingly reduced dimensions, also known as a small form factor. Package technologies have been developed to incorporate multiple components into a single package to reduce the system board space (x-y dimension) and board mounted height ("z-height"). Packages may include a package substrate, one or more integrated circuit (IC) dies, various other active and/or passive components, and package material (also known as "encapsulation") that may all contribute to the package x-y dimensions and z-height and limit the degree to which the package form factor can be reduced.

As various packaging technologies approach the lower limits of their respective form factors, there is an increasing demand for solutions that provide for incremental improvements in the efficiency of space utilization by packaged IC devices.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and/or mechanisms to facilitate operation of one or more integrated circuit (IC) dies of a packaged device with one or more components coupled to the package via a substrate. As used herein, "packaged IC device" (or simply "packaged device") refers to any of a variety of at least partially packaged devices that include a package material and one or more IC dies disposed in the package material. Such a packaged IC device may further comprise a substrate that is coupled to the package material—e.g., where the substrate is external to the package material. In such an embodiment, the packaged IC device may further comprise or coupled to other circuit structure—e.g., including one or more interface contacts, integrated circuit chips and/or circuit components coupled to the IC dies via the substrate.

The substrate may include a cantilever portion that extends past an edge of the package material. In an embodiment, one or more circuit structures are coupled, or otherwise disposed at, a surface of the cantilever portion. As compared with existing packaging technologies, disposing circuit structure at such a cantilever portion may allow for an improved footprint (e.g., area in an x, y plane) and/or an improved z-height profile of the packaged IC device. Alternatively or in addition, a cantilevered substrate structure may provide for improved space utilization in an outer package region of a package-in-package device—e.g., where the cantilevered substrate structure is disposed in additional packaging material using one or more operations adapted from conventional package-in-package fabrication techniques.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including one or more packaged IC devices.

Figure 1:
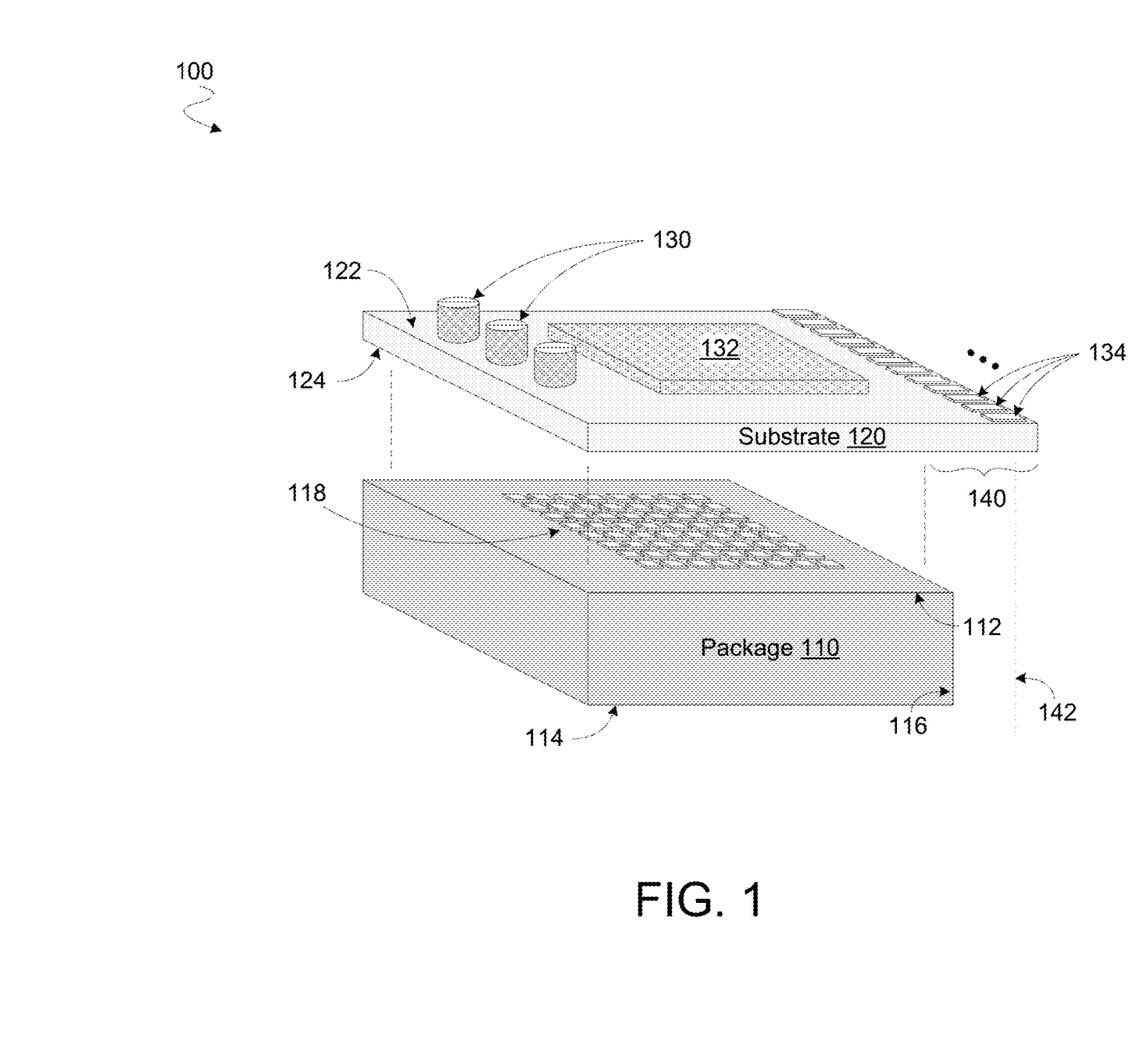
FIG. 1 is an exploded view diagram illustrating elements of a packaged device according to an embodiment.

FIG. 1 is an exploded view illustrating elements of a packaged device 100 to facilitate connection to one or more packaged IC die according to an embodiment. Packaged device 100 may include a processing-capable platform and/or operate as a component of such a platform. For example, packaged device 100 may include any of a variety of packaged devices that are to provide functionality of a processor, a memory subsystem, a system-in-package and/or the like.

In an embodiment, packaged device 100 includes a package 110 comprising a package material having disposed therein one or more IC dies (not shown). The package material may include any of a variety of materials known in the art for packaging integrated circuitry. Examples of such materials include, but are not limited to, an epoxy, polymer, resin, plastic, ceramic etc. The one or more IC dies disposed in package 110 may include a memory die, processor die, application specific integrated circuit (ASIC), a system-onchip and/or any of various other IC die. However, some embodiments are not limited with respect to the particular type and/or number of dies disposed in package 110 (or otherwise included in device 100). In some embodiments, package 110 may comprise one or more passive circuit components that are distinct from, but coupled to, the one or more IC dies.

Packaged device 100 may further comprise a substrate 120 that, for example, is coupled to a side 112 of package 110 (e.g., opposite a side 114 of packaged 110) via one or more contacts 118 formed therein or thereon. In an embodiment, package 110 may further couple via side 114 to another substrate (not shown) that is included in, or is to couple to, device 100.

Substrate 120 may include interconnect structures and interface contacts configured to facilitate access to the one or more IC dies of package 110. In an embodiment, substrate 120 includes an interposer or any of a variety of other such structures to enable functionality such as that adapted from conventional package technologies. By way of illustration and not limitation, substrate 120 may have formed therein one or more vias, traces or other interconnects to allow for communicative coupling between package 110 and other hardware that is included in device 100 or is to couple to device 100. Although certain embodiments are not limited in this regard, substrate 120 may provide for a fanout of interconnects having a relatively large pitch at a side 122 of substrate 120, as compared to a corresponding pitch of such interconnects at an opposite side 124 of substrate 120. Any of a variety of conventional types of package-to-substrate connection structures—including one or more wire-bonds, for example—may be adapted to variously couple circuitry in package 110 to substrate 120 and/or to circuitry disposed on substrate 120.

In addition to package 110, substrate 120 may couple to other circuitry of device 110—e.g., including the illustrative ASIC 132 and one or more other components 130. To accommodate at least some components, contacts, integrated circuit chips and/or other circuit structure, substrate 120 may include a cantilever portion 140 that extends past an edge of package 110. For example, package 110 may include sidewall 116 extending between respective edges of sides 112, 114, where cantilever portion 140 extends past one or both of such edges of sides 112, 114. At least some circuit structures may be coupled or otherwise disposed at cantilever portion 140. By way of illustration and not limitation, one or more contacts 134 may be disposed at a region of cantilever portion 140 forming part of side 122. In some embodiments, one or more circuit structures (not shown) are additionally or alternatively disposed at a region of cantilever portion 140 forming part of side 124. One or more contacts 134 may facilitate coupling of circuit components (not shown) via substrate 120 to one or more IC dies of package 110. Alternatively or in addition, one or more contacts 134 may provide a contact (or contacts) to exchange one or more signals to test such one or more IC dies—e.g., during production of device packaged device 100. One or more additional or alternative cantilever portions (not shown) of substrate 120 may variously extend past sidewall 116 or another sidewall of package 110, according to different embodiments. Circuit structure may be disposed on such a cantilever portion at side 122 and/or side 124.

Figure 2:
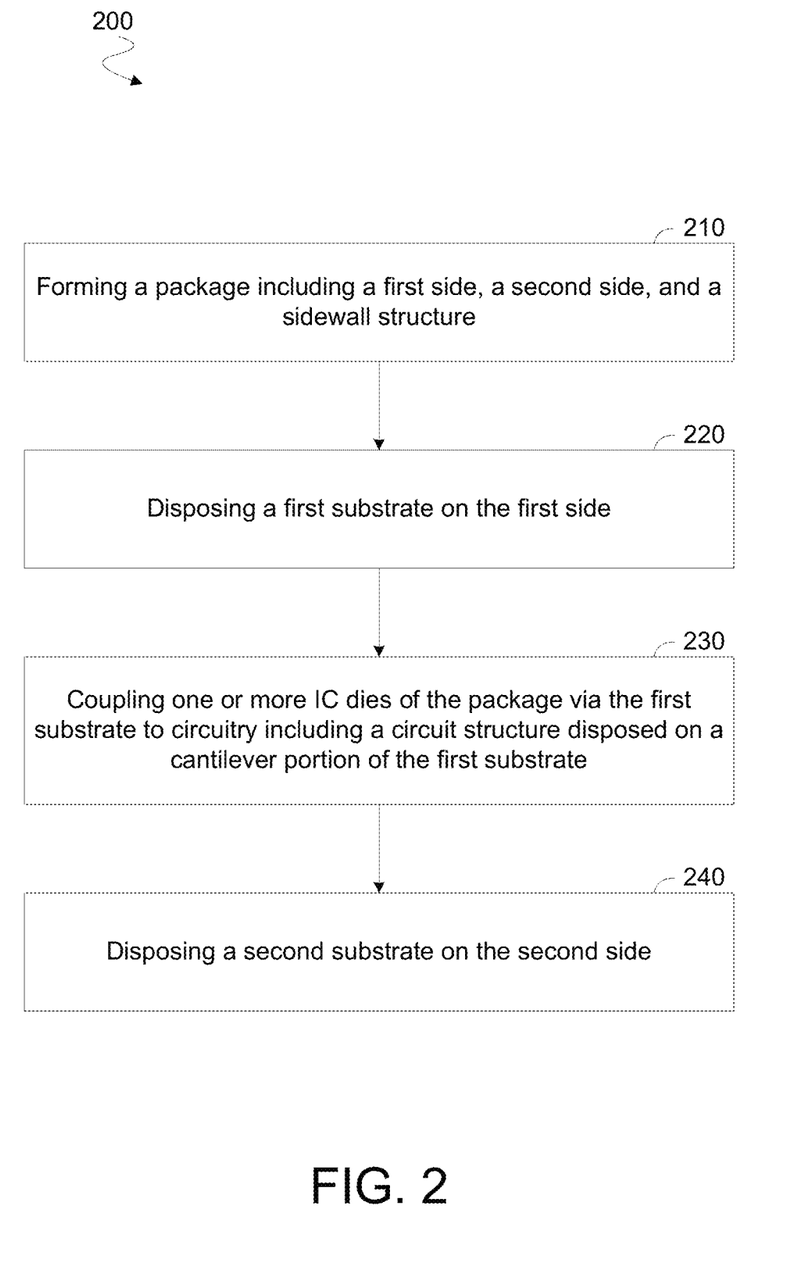
FIG. 2 is a flow diagram illustrating elements of a method to fabricate a packaged device according to an embodiment.

FIG. 2 illustrates elements of a method 200 for fabricating a packaged device according to an embodiment. Method 200 may produce hardware having some or all of the features of packaged device 100, for example. Method 200 may comprise, at 210, forming a first package including a first side, a second side, and a sidewall structure extending between a first edge of the first side and a second edge of the second side. Forming the first package at 210 may include injection molding or otherwise disposing a package material around one or more IC dies that are to be included in the packaged device. The forming at 210 may include one or more operations adapted from conventional packaging techniques.

In some embodiments, method 200 further comprises, at 220, disposing a first substrate on the first side. After the disposing at 220, the first substrate may form a cantilever portion that extends past one or both of the first edge and the second edge. For example, one or both of the first side and the second side may be offset from a line (e.g., line 142 in FIG. 1) that extends from the cantilever portion in a direction perpendicular to the first side (and/or the second side). In one embodiment, forming the package at 210 includes injection molding or otherwise disposing an epoxy (or other such package material) around the one or more IC dies, where the cantilever portion is formed by cutting away a portion of the package material to form the sidewall structure. In another embodiment, the disposing at 220 includes disposing a first portion of the first substrate on the package, and further disposing a second portion of the first substrate on a dummy material that is adjacent to the package. In such an embodiment, the dummy material may be subsequently cut or otherwise removed from both the package material and a side of the cantilever portion. In some embodiments, the first substrate forms multiple cantilever portions after the disposing at 220. For example, two such cantilever portions may each extend past a same side—or alternatively, different (e.g., opposing) sides—of the package.

Method 200 may further include, at 230, coupling the one or more IC dies via the first substrate to circuitry disposed on the first substrate, the circuitry including a circuit structure disposed on the cantilever portion. For example, one or more circuit components, integrated circuit chips and/or interface contacts may be variously coupled to either or both of two opposing sides of the cantilever portion. In one example embodiment, the circuit structure includes one or more contacts, coupled via interconnect paths of the first substrate, to enable testing of the one or more IC dies and/or other circuitry coupled thereto.

Although some embodiments are not limited in this regard, method 200 may further comprise, at 240, disposing a second substrate on the second side of the package. The second substrate may comprise, for example, an interposer that is to facilitate coupling of the eventually-formed packaged device to a printed circuit board or other such hardware. The disposing at 240 may include one or more operations adapted from conventional techniques to form and/or couple an interposer of a packaged device. In one embodiment, the disposing at 240 is performed after a circuit component is soldered or otherwise coupled to the cantilever portion at 230. In some embodiments, method 200 further comprises coupling the one or more IC dies, via the second substrate, to a hardware interface disposed in or on a surface of the second substrate. For example, the hardware interface may include pads, solder bumps and/or other contacts that are variously coupled—e.g., at least via the second substrate—to the one or more IC dies.

FIGS. 3A-3D are cross-sectional views of respective packaged devices 300a, 300b, 300c, 300d each to provide connectivity to one or more IC die according to a corresponding embodiment. Some or all of packaged devices 300a, 300b, 300c, 300d may variously include features of packaged device 100, for example. In an embodiment, method 200 is to fabricate or otherwise produce one or more of packaged devices 300a, 300b, 300c, 300d.

To avoid obscuring certain features of various embodiments, packaged devices 300a, 300b, 300c, 300d are shown as having some components in common with each other. In each of the embodiments variously represented by FIGS. 3A-3D, such components may each provide the same respective functionality and may be similarly configured relative to one another. However, one of ordinary skill in the manufacture of packaged integrated circuit devices, with the benefit of the disclosure herein, will appreciate that certain embodiments are not limited to the particular number, type and/or configuration of such components.

Packaged devices 300a, 300b, 300c, 300d are each shown as including an illustrative one or more IC dies 322 comprising, for example, a memory die (e.g., including DRAM, NAND memory or the like), an ASIC memory controller, a processor die and/or any of various other IC dies. The one or more IC dies 322 are variously packaged and mounted on a side 312 of a substrate 310, such as an interposer. One or more components 318—e.g., including any of various capacitors, inductors, resistors, voltage regulators and/or the like—may also be variously coupled to substrate 310 (for example, via side 312). The one or more components 318 may be variously coupled via substrate 310, wire bonding 324 and/or other connection hardware to some or all of the one or more IC dies 322. The one or more IC dies 322 may be further coupled to other circuitry, as represented by the illustrative ASIC 332 and components 334 (e.g., including one or more resistors, capacitors and/or other circuit elements). However, the particular number, type, configuration etc. of some or all of these common components of packaged devices 300a, 300b, 300c, 300d are not limiting on various embodiments.

Figure 3A:
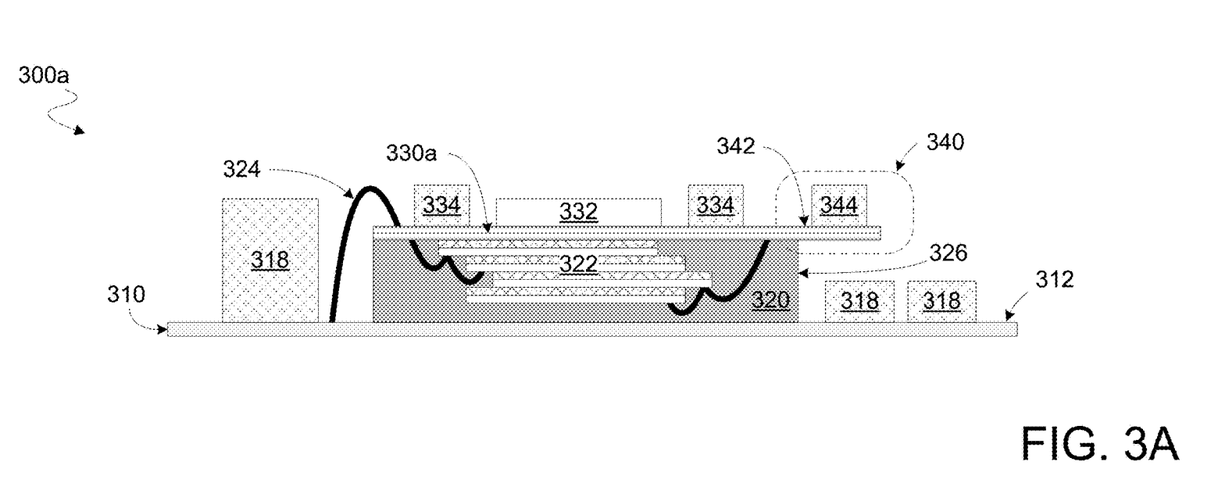
FIGS. 3A-3D are cross-sectional views each illustrating respective operations each to fabricate a packaged device according to a corresponding embodiment.

In the embodiment illustrated by FIG. 3A, packaged device 300a includes a package 320 having one or more IC dies 322 disposed therein. A substrate 330a of packaged device 300a may be coupled to package 320, where substrate 330a facilitates coupling of package 320 (and one or more IC dies 322) to other circuitry that is included in, or is to couple to, packaged device 300a. For example, ASIC 332 and/or one or more components 334 may variously couple to a region of substrate 300a that overlaps package 320.

In some embodiments, substrate 330a includes a cantilever portion 340 that extends past an edge of package 320—e.g., where at least part of cantilever portion 340 is located past a plane in which extends a sidewall 326 of package 320. Circuit structure, such as the illustrative component 344, may be disposed at cantilever portion 340. In one example embodiment, component 344 includes one or more resistors, capacitors and/or other circuit elements that couple to cantilever portion 320—e.g., at a side 342 of substrate 330a facing away from substrate 310. Alternatively or in addition, one or more integrated circuit chips (e.g., including ASIC 332) and/or interface contacts may be at least partially disposed on cantilever portion 340. Cantilever portion 340 may enable efficient use of a three-dimensional space in which is disposed circuitry variously mounted, directly or indirectly, on substrate 310. For example, location of component 344 on cantilever 340 may allow for package 320 and/or substrate 310 to have a smaller design. Alternatively or in addition, location of component 344 on cantilever 340 may allow for additional circuitry to be disposed on substrate 310.

Figure 3B:
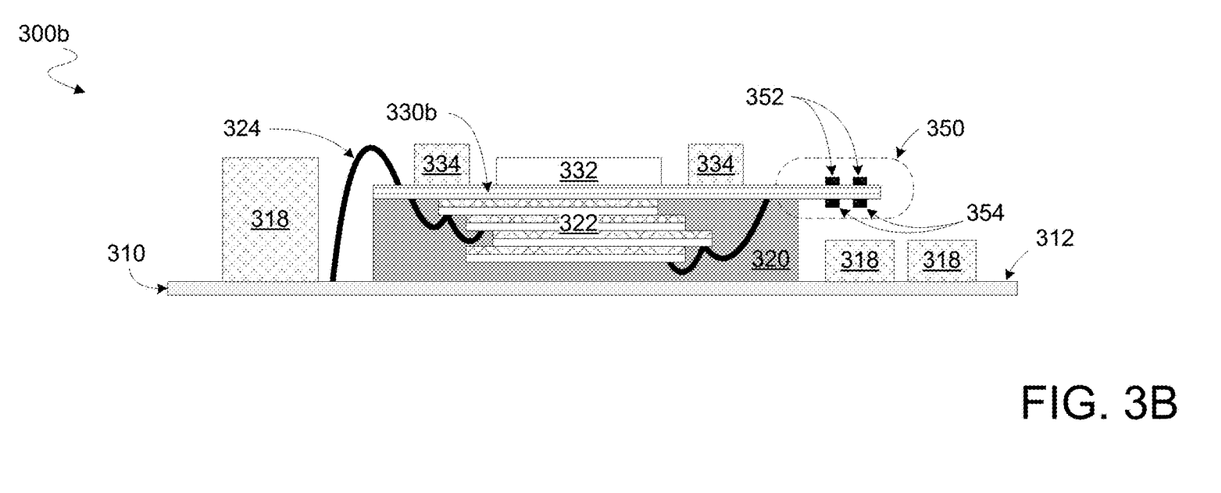

In the embodiment illustrated by FIG. 3B, package 320 (having one or more IC dies 322 disposed therein) is instead coupled to a substrate 330b of packaged device 300b, where substrate 330b comprises a cantilever portion 350. Circuit structure may be variously disposed on each of two opposing sides of cantilever portion 350. By way of illustration and not limitation, one side of cantilever portion 350 may have contacts 352 disposed thereon, where an opposite side of cantilever portion 350 has contacts 354 disposed thereon. Contacts 352, 354 may include one or more contacts (e.g., including any of a variety of pads, pins, balls, bumps and/or other conductive connection structures) that facilitates for testing of one or more IC die 322 and/or other circuitry of packaged device 300b. Such testing may take place prior to processing that, for example, is to dispose additional package material (not shown) around package 320 and other circuitry mounted on substrate 310. Alternatively or in addition, contacts 352, 354 may include one or more contacts that are to provide for coupling of another circuit component (not shown) to substrate 330b.

Figure 3C:
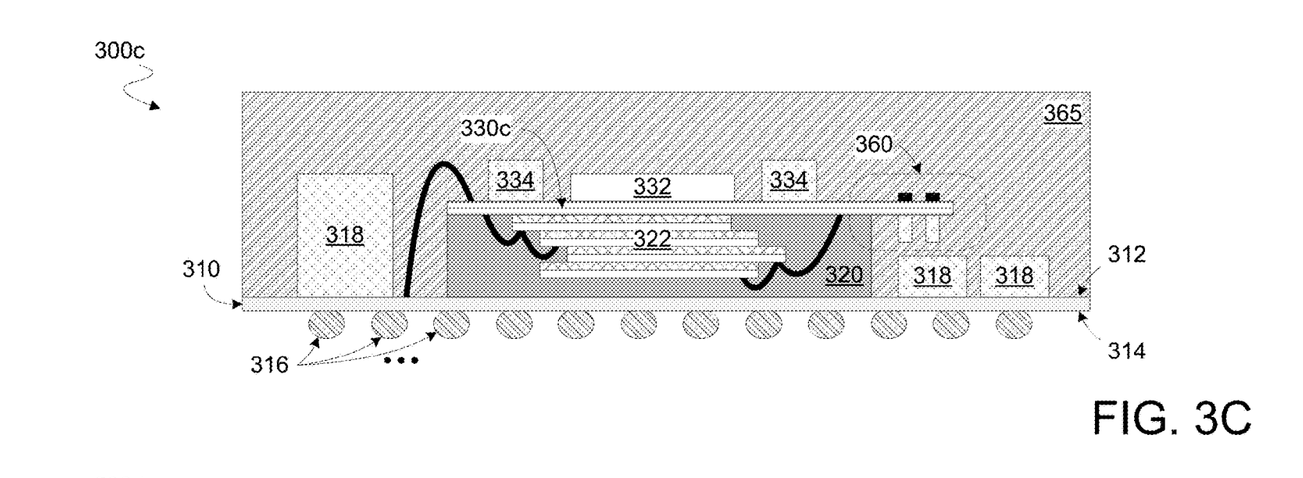

In the embodiment illustrated by FIG. 3C, package 320 is instead coupled to a substrate 330c of packaged device 300c, where substrate 330c comprises a cantilever portion 360. Circuit structure disposed on cantilever portion 360 may include, for example, one or more components disposed on a side of substrate 330c that faces toward substrate 310. Alternatively or in addition, one or more test contacts, for example, may be disposed on a side of cantilever portion 360 that faces away from substrate 310. Packaged device 300c enables space efficient positioning of components on and/or under cantilever portion 360—e.g., for improved positioning of one or more contacts that, after a testing phase, will be covered by package material 365 of packaged device 300c. In one embodiment, a hardware interface 316 (e.g., including solder bumps) may be formed on a side 314 of substrate 310 to enable coupling of packaged device 300c to a printed circuit board, another packaged device or other such hardware.

Figure 3D:
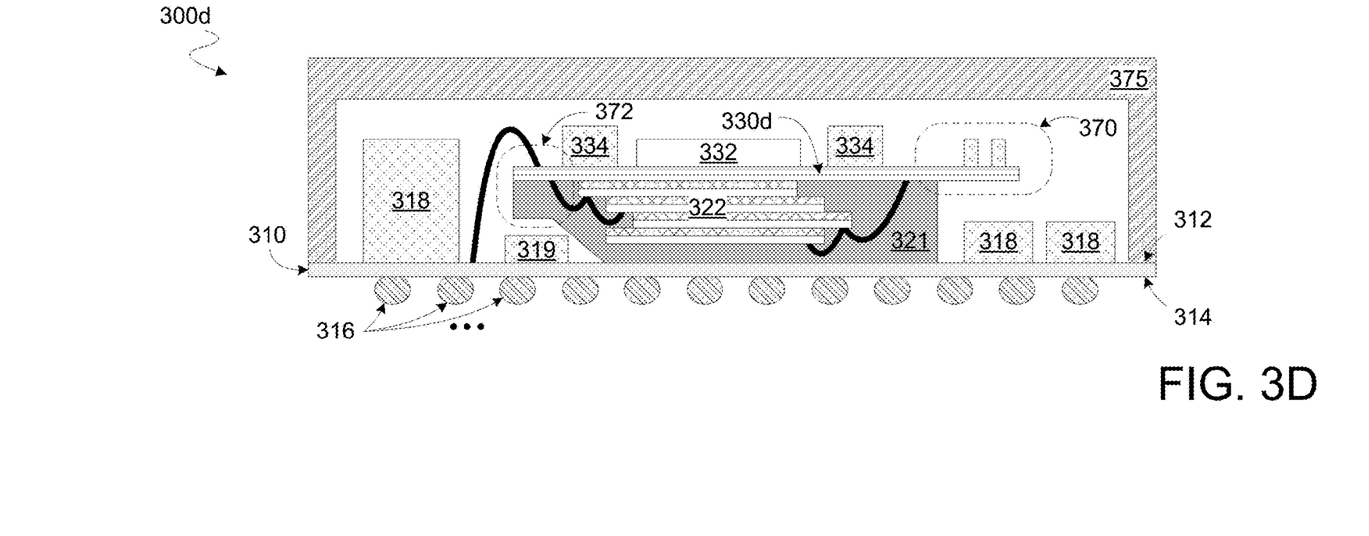

In the embodiment illustrated by FIG. 3D, a package 321 of packaged device 300d has disposed therein the one or more IC dies 322. Substrate 330d is one example of an embodiment wherein multiple cantilever portions variously extend each past a respective edge or edges of a package. By way of illustration and not limitation, substrate 330d may include a cantilever portion 370 and another cantilever portion 372. Substrate 330d may adjoin an edge of package 321, where cantilever portion 370 (for example) extends past that edge in a direction away from package 320. However, cantilever portion 372 is one example embodiment of an additional or alternative cantilever portion that extends past some edge of a package, where the substrate including that cantilever portion does not adjoin the edge. For example, package 321 may form a sidewall structure that extends at an oblique angle between substrate 310 and substrate 330d. The angled slope of such a sidewall structure may allow for one or more components (e.g., including the illustrative component 319) to be external to, but partially disposed under, package 321. In such an embodiment, cantilever portion 372 may extend past an edge of the sidewall structure that is located at substrate 310. Any of a variety of combinations of respective components, interface contacts, integrated circuit chips and/or other circuit structure may be variously formed in or on cantilever portions 370, 372. Although some embodiments are not limitation in this regard, packaged device 300d may include a package structure 375 mounted over, coupled to or otherwise disposed on substrate 310.

Figure 4:
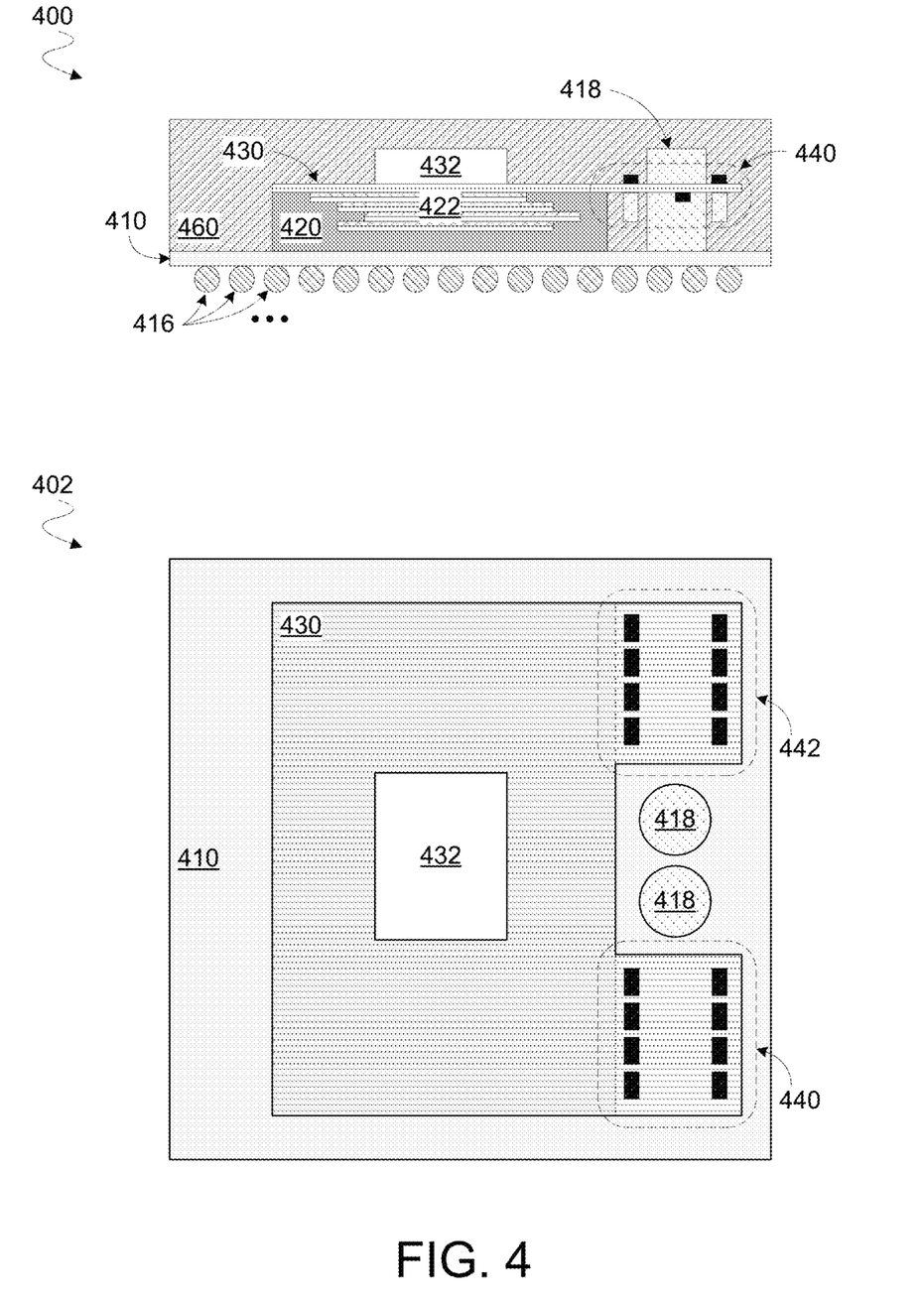
FIG. 4 shows cross-sectional views variously illustrating elements of a packaged device according to an embodiment.

FIG. 4 shows a cross-sectional view of a packaged device 400 to provide connection of circuitry to one or more IC dies according to a corresponding embodiment. FIG. 4 also shows a top view 402 of packaged device 400. The packaged device 400 may variously include features of one of packaged devices 100 and 300a-300d, for example. In an embodiment, packaged device 400 is fabricated according to method 200.

Packaged device 400 may include a package 420 having one or more IC dies 422 disposed therein. Opposite sides of package 420 may be coupled each to a respective one of a substrate 410 (e.g., an interposer) and another substrate 430. Other components of packaged device 400 (e.g., including any of various capacitors, inductors, resistors, voltage regulators and/or the like) may be mounted on substrate 410, where one or more such components are wire bonded, flip chip connected and/or otherwise coupled—e.g., via substrate 410—to operate with one or more IC dies 422. By way of illustration and not limitation, such other components may include one or more components 418 that extend from substrate 410 to (and in an embodiment, through) a plane in which substrate 430 extends. Substrate 430 may facilitate connection of one or more IC dies 422 to substrate 410 and/or components mounted on substrate 410. Integrated circuitry and/or other components of packaged device 400— e.g., including the illustrative IC die 432—may couple to substrate 430 in a region that overlaps package 420.

In some embodiments, substrate 430 includes cantilever portions 440, 442 that (for example) both extend past the same side of package 420. Cantilever portions 440, 442 may each have one or more respective components, contacts, integrated circuit chips and/or other circuit structure disposed thereon. In an embodiment, the one or more components 418 (and/or other circuitry mounted on substrate 410) extend between and above cantilever portions 440, 442. In another embodiment, packaged device 400 includes a single cantilever portion that, for example, extends between two components mounted on substrate 410. In providing a component, mounted on substrate 410, that extends between cantilever portions 440, 442 (and/or providing a cantilever portion that extends between components mounted on substrate 410), some embodiments variously enable the design of packaged devices that have a reduced z-height and/or reduced x-y dimensions. Alternatively or in addition, cantilever portions 440, 442 may provide for improved space utilization in an outer package region of packaged device 400—e.g., where cantilever portions 440, 442 are disposed in additional package material 460. In one embodiment, a hardware interface 416 (e.g., including solder bumps) is formed on a side of substrate 410 to enable coupling of packaged device 400 to another device.

Figure 5:
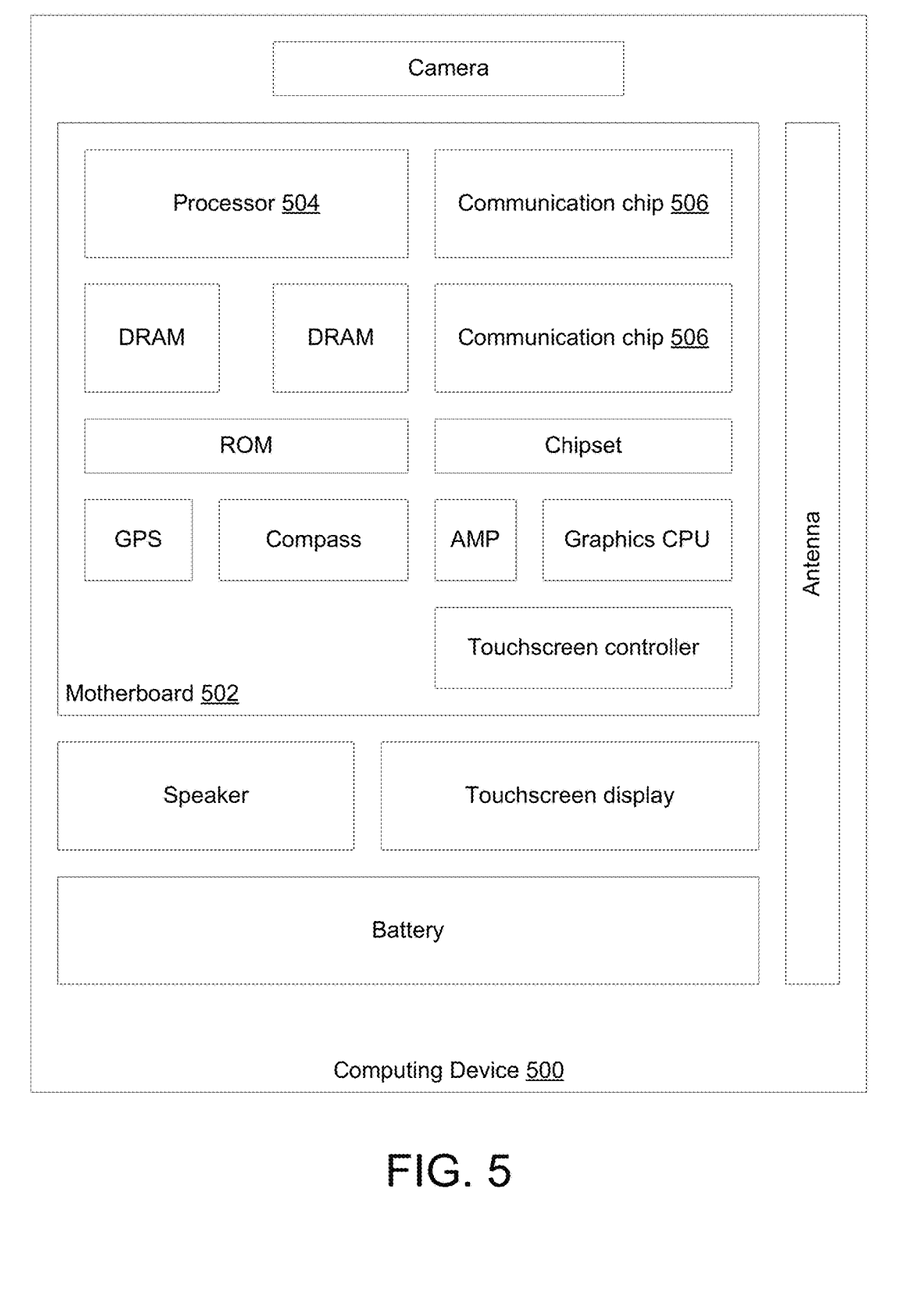
FIG. 5 illustrates a computing device in accordance with one embodiment.

FIG. 5 illustrates a computing device 500 in accordance with one embodiment. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. The term "processor" may refer to any device or portion of a device that processes electronic data from registers and/or memory to transform that electronic data into other electronic data that may be stored in registers and/or memory. The communication chip 506 also includes an integrated circuit die packaged within the communication chip 506.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
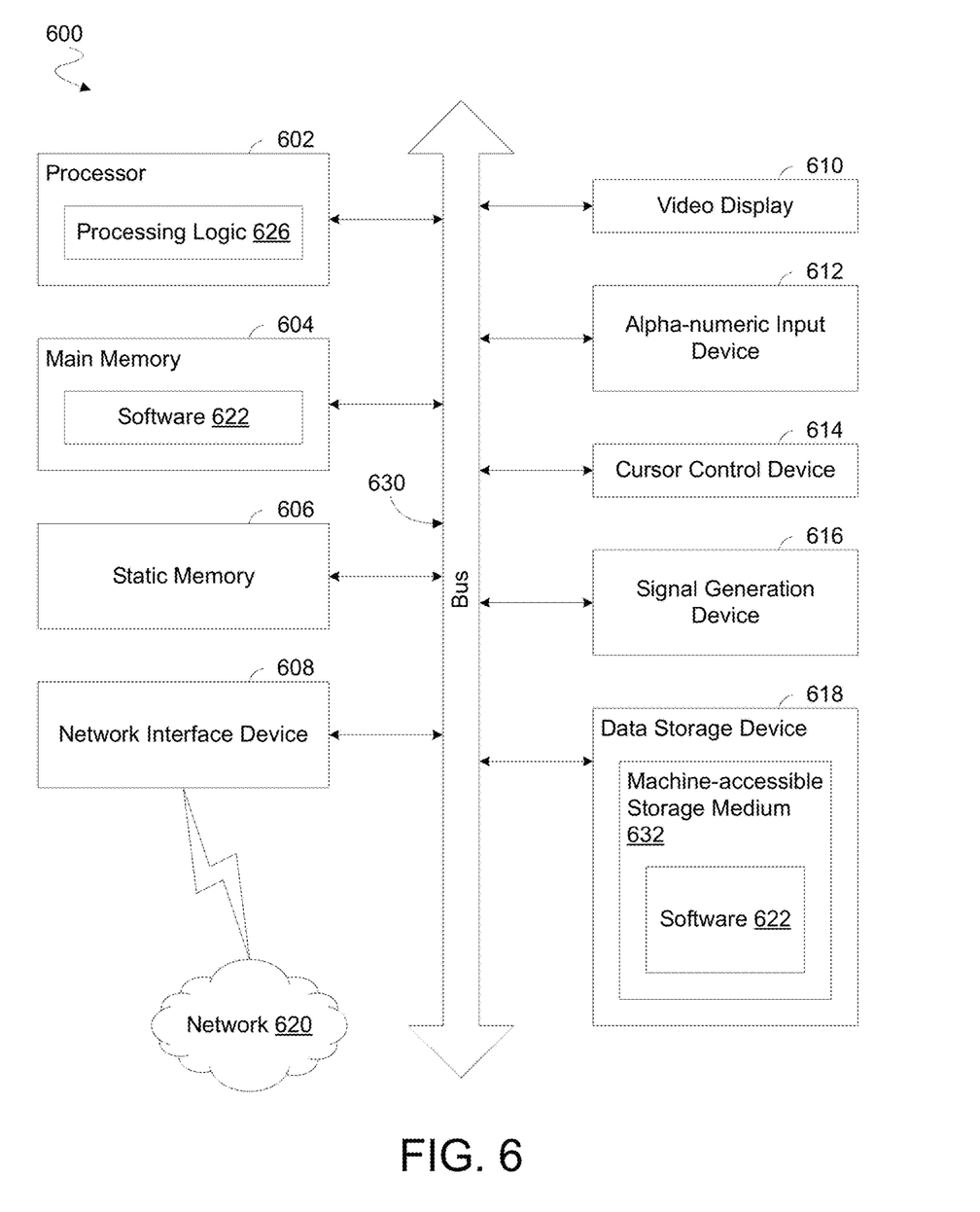
FIG. 6 illustrates a block diagram of an exemplary computer system, in accordance with an embodiment.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of an embodiment. The term "machine-readable storage medium" shall accordingly be taken to include, but not be limited to, solid-state memories, and optical and magnetic media.

Figure 7:
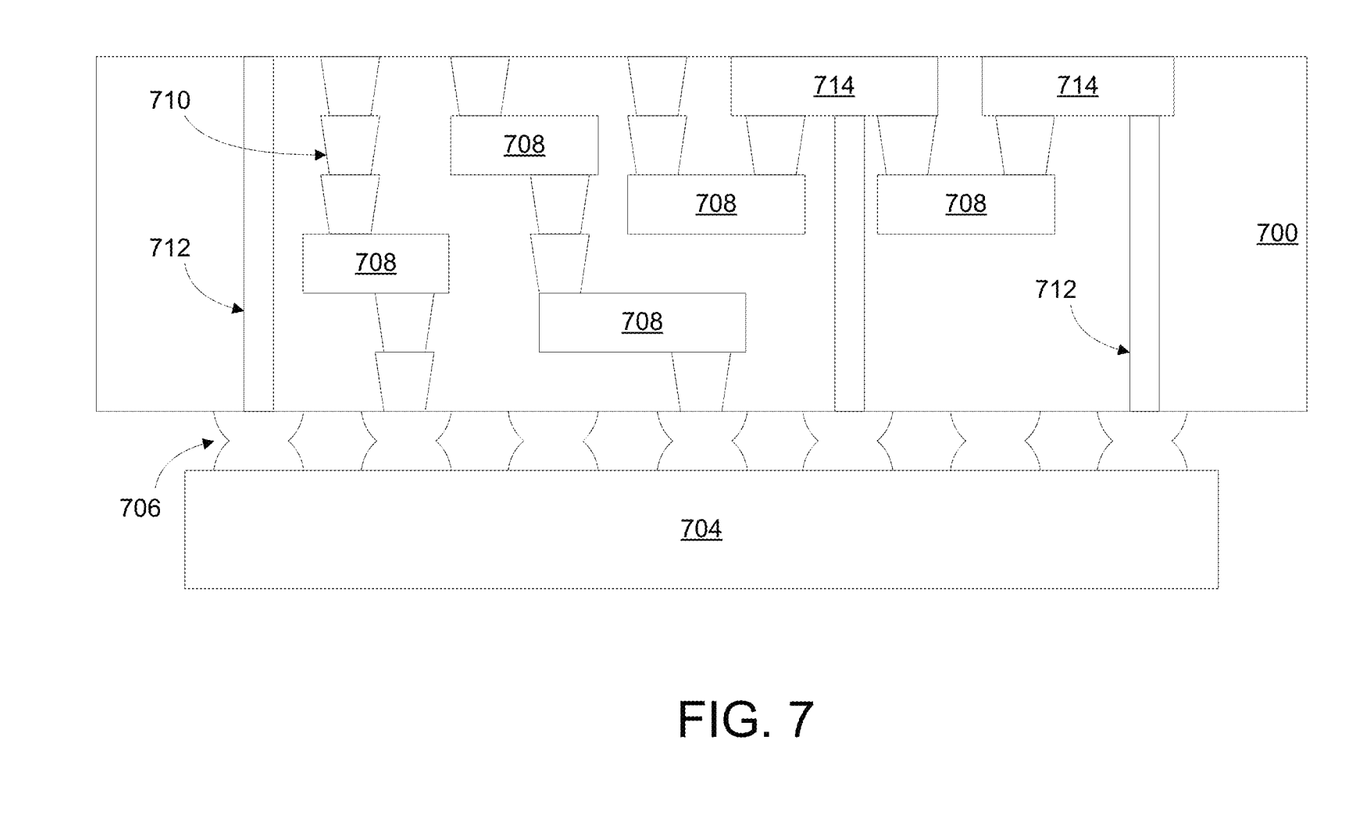
FIG. 7 is an interposer implementing one or more embodiments.

FIG. 7 illustrates an interposer 700 that includes one or more embodiments. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702, 704 are attached to opposing sides of the interposer 700. In other embodiments, the first and second substrates 702, 704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with some embodiments, apparatuses or processes disclosed herein may be used in the fabrication of interposer 700.

Figure 8:
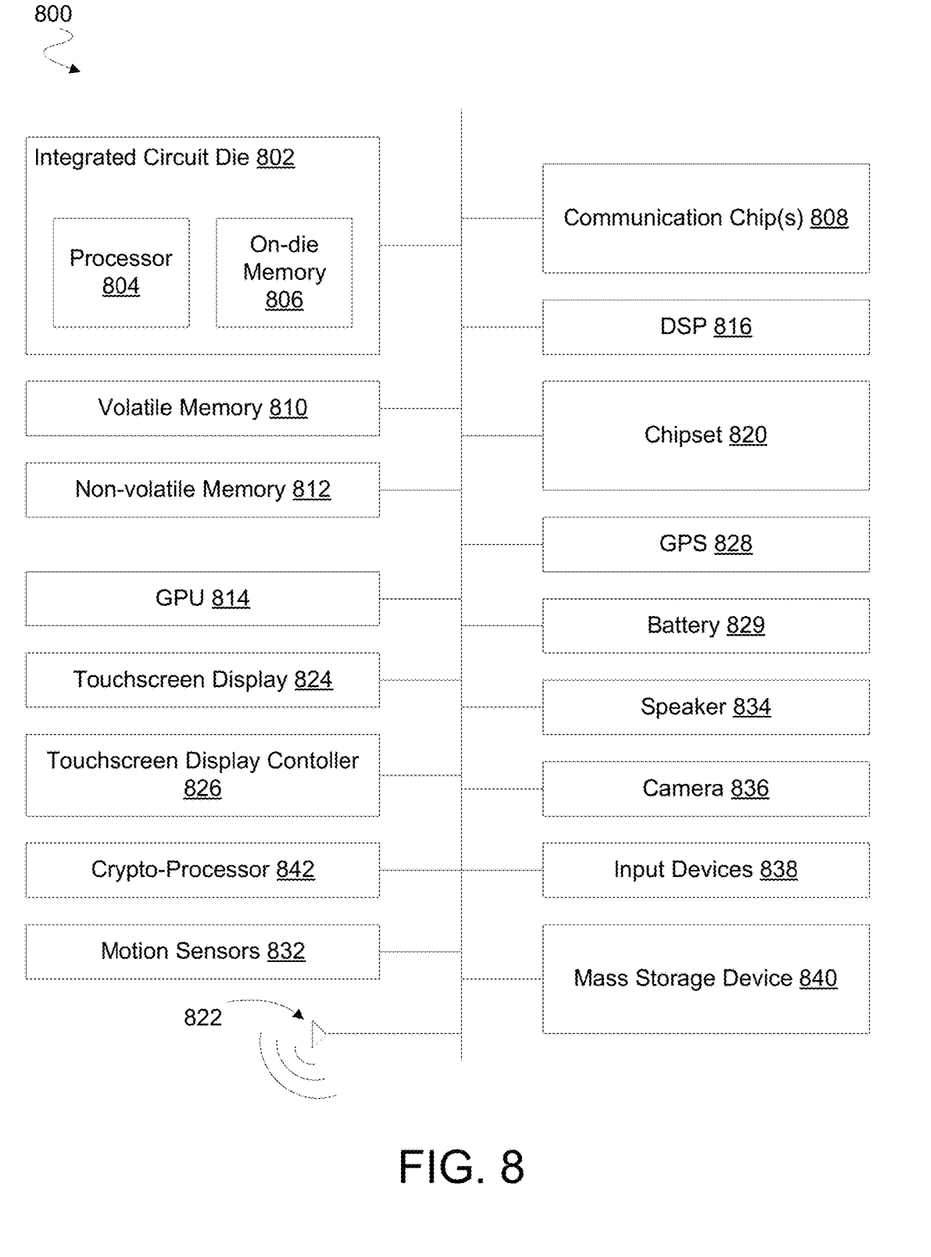
FIG. 8 is a computing device built in accordance with an embodiment.

FIG. 8 illustrates a computing device 800 in accordance with one embodiment. The computing device 800 may include a number of components. In one embodiment, these components are attached to one or more motherboards. In an alternate embodiment, these components are fabricated onto a single system-on-a-chip (SoC) die rather than a motherboard. The components in the computing device 800 include, but are not limited to, an integrated circuit die 802 and at least one communication chip 808. In some implementations the communication chip 808 is fabricated as part of the integrated circuit die 802. The integrated circuit die 802 may include a CPU 804 as well as on-die memory 806, often used as cache memory, that can be provided by technologies such as embedded DRAM (eDRAM) or spin-transfer torque memory (STTM or STTM-RAM).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 829 or other power source, a power amplifier (not shown), a global positioning system (GPS) device 828, a compass 830, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications chip 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 808. For instance, a first communication chip 808 may be dedicated to shorter range wireless communications such as Wi-Fi and Bluetooth and a second communication chip 808 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. In various embodiments, the computing device 800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

In one implementation, a device comprises a first package including a package material and one or more integrated circuit (IC) dies disposed in the package material, wherein the first package includes a first side, a second side, and a sidewall structure extending between a first edge of the first side and a second edge of the second side, and a first substrate disposed to the first side, wherein one of the first side and the second side is offset from a line extending from a first cantilever portion of the first substrate in a direction perpendicular to the first side. The device further comprises circuitry disposed on the first substrate, wherein the one or more IC dies is coupled to the circuitry via the first substrate, the circuitry including a circuit structure disposed on the first cantilever portion, and a second substrate disposed to the second side, wherein the one or more IC are dies coupled via the second substrate to a hardware interface disposed in or on a surface of the second substrate.

In another embodiment, only one of the first side and the second side is offset from the line. In another embodiment, the circuit structure is an interface contact. In another embodiment, the interface contact is configured to exchange one or more signals to test the one or more IC dies. In another embodiment, the circuit structure is disposed on a side of the first cantilever portion that faces toward the second substrate. In another embodiment, the device further comprises another circuit structure disposed on a side of the first cantilever portion that faces away from the second substrate. In another embodiment, the first substrate forms a second cantilever portion that extends past an edge of the first package. In another embodiment, the first cantilever portion and the second cantilever portion both extend past the edge of the first package In another embodiment, the device further comprises a component mounted on the second substrate, wherein the component extends between the first cantilever portion and the second cantilever portion at a plane in which the first substrate extends. In another embodiment, the device further comprises additional package material disposed around the first package and the first substrate.

In another implementation, a method comprises forming a first package, including disposing a package material around one or more integrated circuit (IC) dies, wherein the first package includes a first side, a second side, and a sidewall structure extending between a first edge of the first side and a second edge of the second side, and disposing a first substrate on the first side, wherein one of the first side and the second side is offset from a line extending from a first cantilever portion of the first substrate in a direction perpendicular to the first side. The method further comprises coupling the one or more IC dies via the first substrate to circuitry disposed on the first substrate, the first circuitry including a circuit structure disposed on the first cantilever portion, and disposing a second substrate on the second side.

In another embodiment, only one of the first side and the second side is offset from the line. In another embodiment, the circuit structure is an interface contact. In another embodiment, coupling the one or more IC dies to the circuitry includes configuring the interface contact to exchange one or more signals to test the one or more IC dies. In another embodiment, coupling the one or more IC dies to the circuitry includes disposing the circuit structure on a side of the first cantilever portion that faces toward the second substrate. In another embodiment, coupling the one or more IC dies to the circuitry further comprises disposing another circuit structure on a side of the first cantilever portion that faces away from the second substrate. In another embodiment, the first substrate forms a second cantilever portion that extends past an edge of the first package. In another embodiment, the first cantilever portion and the second cantilever portion both extend past the edge of the first package In another embodiment, the method further comprises mounting a component on the second substrate, wherein the component extends between the first cantilever portion and the second cantilever portion at a plane in which the first substrate extends. In another embodiment, the method further comprises disposing additional package material around the first package and the first substrate.

In another implementation, a system comprises a packaged device including a first package including a package material and one or more integrated circuit (IC) dies disposed in the package material, wherein the first package includes a first side, a second side, and a sidewall structure extending between a first edge of the first side and a second edge of the second side, and a first substrate disposed to the first side, wherein one of the first side and the second side is offset from a line extending from a first cantilever portion of the first substrate in a direction perpendicular to the first side. The packaged device further comprises circuitry disposed on the first substrate, wherein the one or more IC dies is coupled to the circuitry via the first substrate, the circuitry including a circuit structure disposed on the first cantilever portion, and a second substrate disposed to the second side, wherein the one or more IC are dies coupled via the second substrate to a hardware interface disposed in or on a surface of the second substrate. The system further comprises a display device coupled to the packaged device, the display device to display an image based on signals exchanged with the one or more IC dies.

In another embodiment, only one of the first side and the second side is offset from the line. In another embodiment, the circuit structure is an interface contact. In another embodiment, the interface contact is configured to exchange one or more signals to test the one or more IC dies. In another embodiment, the circuit structure is disposed on a side of the first cantilever portion that faces toward the second substrate. In another embodiment, the packaged device further comprises another circuit structure disposed on a side of the first cantilever portion that faces away from the second substrate. In another embodiment, the first substrate forms a second cantilever portion that extends past an edge of the first package. In another embodiment, the first cantilever portion and the second cantilever portion both extend past the edge of the first package In another embodiment, the packaged device further comprises a component mounted on the second substrate, wherein the component extends between the first cantilever portion and the second cantilever portion at a plane in which the first substrate extends. In another embodiment, the packaged device further comprises additional package material disposed around the first package and the first substrate.

Techniques and architectures for arranging circuit components are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A system comprising a packaged device including:
   a first package including a package material and one or more integrated circuit (IC) dies disposed in the package material, wherein the first package includes a first side, a second side, and a sidewall structure extending between a first edge of the first side and a second edge of the second side;
   a first substrate disposed to the first side, wherein one of the first side and the second side is offset from a line extending from a first cantilever portion of the first substrate in a direction perpendicular to the first side;
   circuitry disposed on the first substrate, wherein the one or more IC dies is coupled to the circuitry via the first substrate, the circuitry including a circuit structure disposed on the first cantilever portion; and
   a second substrate disposed to the second side, wherein the one or more IC are dies coupled via the second substrate to a hardware interface disposed in or on a surface of the second substrate; and
   a display device coupled to the packaged device, the display device to display an image based on signals exchanged with the one or more IC dies.

2. The system of claim 1, wherein only one of the first side and the second side is offset from the line.

3. The system of claim 1, wherein the circuit structure is an interface contact.

4. The system of claim 1, wherein the circuit structure is disposed on a side of the first cantilever portion that faces toward the second substrate.

5. The system of claim 1, wherein the first substrate forms a second cantilever portion that extends past an edge of the first package.

* * * * *